(12) United States Patent
Lin

(10) Patent No.: US 11,532,665 B2
(45) Date of Patent: Dec. 20, 2022

(54) MANUFACTURING METHOD AND MANUFACTURING MACHINE FOR REDUCING NON-RADIATIVE RECOMBINATION OF MICRO LED

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 114 days.

(21) Appl. No.: 17/129,533

(22) Filed: Dec. 21, 2020

(65) Prior Publication Data

US 2022/0199675 A1   Jun. 23, 2022

(51) Int. Cl.
*H01L 27/15* (2006.01)
*H01L 33/00* (2010.01)
*H01L 33/46* (2010.01)

(52) U.S. Cl.
CPC ........ *H01L 27/156* (2013.01); *H01L 33/0095* (2013.01); *H01L 33/46* (2013.01)

(58) Field of Classification Search
CPC combination set(s) only.
See application file for complete search history.

(56) References Cited

U.S. PATENT DOCUMENTS

| | | | |
|---|---|---|---|
| 2016/0315218 A1* | 10/2016 | Bour | H01L 33/0025 |
| 2018/0175248 A1* | 6/2018 | Ahmed | H01L 25/0753 |

* cited by examiner

*Primary Examiner* — Ratisha Mehta
(74) *Attorney, Agent, or Firm* — Chun-Ming Shih; HDLS IPR Services

(57) ABSTRACT

The present disclosure is a manufacturing method for reducing non-radiative recombination of micro LED. At least one etched LED epitaxial wafer includes a plurality of etching grooves and mesas, an etched sidewall of the mesa includes a stack of a first type semiconductor layer, an active layer and a second type semiconductor layer. Two stages of ALD are performed on the etched LED epitaxial wafer with different temperature ranges. The first ALD can be used to repair dangling bonds and defects on the etched side walls of the mesa, and the second ALD can be used to form a passivation layer on the etched side walls of the mesa. By the manufacturing method of the present disclosure, non-radiative recombination of the micro LED can be reduced, and the luminous brightness and luminous efficiency of the micro LED can be improved.

12 Claims, 7 Drawing Sheets

MANUFACTURING METHOD AND MANUFACTURING MACHINE FOR REDUCING NON-RADIATIVE RECOMBINATION OF MICRO LED

TECHNICAL FIELD

The present disclosure relates to a manufacturing method and manufacturing machine for reducing non-radiative recombination of micro LED (light-emitting diode), which can reduce non-radiative recombination occurring on the micro LED, and effectively improve luminous brightness and luminous efficiency of the micro LED.

BACKGROUND

Light-emitting diodes (LEDs) have advantages such as high conversion efficiency, long lifetime, small-sized and high safety, thus already become new-generation light sources. Besides, the LEDs also have replaced traditional cold cathode tubes as new backlight sources of display panels, especially adapt to be employed in small-sized portable electronics, such as notebook computers, cell phones and tablet computers.

Liquid-crystal displays (LCDs) do not emit light by themselves and have a drawback of low efficiency, even when the LCD is showing white color, usually there is merely less than 10% of light emitted by the backlight source that can pass the display panel, which consumes more electric power of the portable electronic. Moreover, besides of the backlight source, the LCDs further require more devices, such as polarizers, liquid crystal and color filters to perform, therefore it is difficult to reduce size of the LCDs.

On contrary, organic LEDs (OLEDs) have advantages of self-lighting, wide viewing angle, high-contrast, power-saving, high responding speed and flexibility, such that the OLEDs are replacing the LCDs to become the new-generation electronics. However, the OLEDs still have drawbacks, such as screen burn-in, short lifetime, color decay and pulse-width modulation (PWN), as so, top brands in the industry are developing next-generation display panels.

So far, the micro LED displays have a great opportunity to become the next-generation display panels. The micro LED displays are also self-lighting, and further have advantages of high color saturation, short responsive time and long lifetime.

Currently, to commercialize micro LEDs, there are yet many technical and cost difficulties to overcome. In manufacturing of LEDs, metalorganic chemical-vapour deposition (MOCVD) is mainly employed to grow epitaxial material on a sapphire substrate, to form an LED epitaxial wafer. Next to etch the LED epitaxial wafer to form a plurality of etched grooves and mesas thereon. Thereafter to slice the LED epitaxial wafer along the etched grooves, to complete the making of the LED epitaxies.

During the process of etching LED epitaxial wafer, defects and dangling bonds occurs on sidewalls of the mesas formed with the etched grooves, which causes non-radiative recombination in the etched sidewalls of the LEDs, and further affects luminous brightness of the LEDs.

The traditional LEDs have the mesas far larger than the etched sidewalls, therefore an effect of the non-radiative recombination on the overall luminous brightness is rather small, usually ignorable. However, for the micro LEDs, the mesas are extremely small, therefore the effect of the non-radiative recombination on the etched sidewalls are also extremely large. Hence, how to reduce the non-radiative recombination occurring on the etched sidewalls, this already becomes a main problem for commercializing micro LEDs.

SUMMARY

To solve the problem of the conventional technology, the present disclosure provides a manufacturing method for reducing non-radiative recombination of micro LED, which can effectively repair the defects and dangling bonds on the etched sidewalls of the mesas later being the micro LEDs, and form a passivation layer on the mesas later being the micro LEDs, to reduce the non-radiative recombination occurring on the etched sidewalls of the micro LEDs.

An object of the present disclosure is to provide a manufacturing method for reducing non-radiative recombination of micro LED, which is mainly used to process the etched LED epitaxial wafer. The LED epitaxial wafer includes a substrate, a first-type semiconductor layer, an active layer and a second-type semiconductor layer, wherein the first-type semiconductor layer, the active layer and the second-type semiconductor layer are stacked on the substrate. A plurality of etched grooves and mesas are formed on a surface of the etched LED epitaxial wafer, wherein the etched sidewalls of the mesas include the exposed first-type semiconductor layer, active layer and second-type semiconductor layer. Thereafter, the process may be performed to slice the LED epitaxial wafer along the etched grooves, and produce a plurality of micro LEDs.

In the etching process, at least one dangling bond and/or at least one defect will be formed on the etched sidewalls of the LED epitaxial wafer, and non-radiative recombination occurs on the etched sidewalls of the micro LEDs and the mesas. The micro LEDs are small-sized, commonly in a range of 10-100 um, such that sizes of the micro LEDs so as the size of the mesas are close to that of the etched sidewalls. Therefore, when non-radiative recombination occurring on the etched sidewalls, this will greatly affect luminous brightness of the micro LEDs. Hence, the present disclosure provides a manufacturing method for reducing non-radiative recombination of micro LED, which mainly repairs the defects and dangling bonds for the etched LED epitaxial wafer, and then perform atomic-layer deposition (ALD) on the repaired LED epitaxial wafer, to form a passivation layer on the etched sidewalls of the mesas later being the micro LEDs, to prevent the non-radiative recombination occurring on the etched sidewalls of the mesas later being the micro LEDs, and then to effectively improve the luminous brightness and conversion efficiency of the micro LEDs.

An object of the present disclosure is to provide a manufacturing method for reducing non-radiative recombination of micro LED, which mainly is to perform two stages of ALD to at least one etched LED epitaxial wafer, wherein each stage of the ALD is performed with different temperatures. A first ALD is performed to the etched LED epitaxial wafer, this can repair dangling bonds and/or defects on the etched sidewalls. A second ALD is performed to the LED epitaxial wafer etched by the first ALD, this will form a passivation layer on the etched sidewalls of the LED epitaxial wafer, to prevent non-radiative recombination from occurring on the etched sidewalls of the micro LED and the mesas.

An object of the present disclosure is a manufacturing method for reducing non-radiative recombination of micro LED, which is mainly to place the etched LED epitaxial wafer into a reaction chamber and transfer a repair gas into the reaction chamber. The repair gas reacts with dangling bonds and/or defects of the etched sidewalls, and repairs the dangling bonds and/or defects of the LED epitaxial wafer. Thereafter, an ALD is performed to the repaired LED epitaxial wafer, and then to form a passivation layer on the etched sidewalls of the mesas.

Additionally, the method also includes to decide whether or not to provide an alternative-current (AC) voltage to an AC coil adjacent to the reaction chamber and to transform the repair gas into a plasma. The repair gas transformed into the plasma can improve an effect and efficiency of repairing the dangling bonds and/or defects on the LEDs, and aid in reducing non-radiative recombination occurring on the etched sidewalls of the mesas later being the micro LEDs.

To achieve the abovementioned objects, the present disclosure presents a manufacturing method for reducing non-radiative recombination of micro LED, which includes: providing at least one etched LED epitaxial wafer, wherein, the etched LED epitaxial wafer includes a plurality of etched grooves and mesas, each of the mesas includes a first-type semiconductor layer, an active layer and a second-type semiconductor layer, the active layer is positioned between the first-type semiconductor layer and the second-type semiconductor layer; performing a first ALD to the LED epitaxial wafer in a first temperature range; performing a second ALD to the LED epitaxial wafer etched by the first ALD in a second temperature range, then to form a passivation layer on the first-type semiconductor layer, the active layer and the second-type semiconductor layer of the at least one etched sidewall of the mesa, wherein the first temperature range and the second temperature range are different.

The present disclosure provides another manufacturing method for reducing non-radiative recombination of micro LED, which includes: providing at least one etched LED epitaxial wafer, wherein, the etched LED epitaxial wafer includes a plurality of etched grooves and mesas, each of the mesas includes a first-type semiconductor layer, an active layer and a second-type semiconductor layer, the active layer is positioned between the first-type semiconductor layer and the second-type semiconductor layer; placing the etched LED epitaxial wafer into a reaction chamber and transfer a repair gas into the reaction chamber, wherein the repair gas reacts with the etched LED epitaxial wafer; and a step of performing an ALD to the etched LED epitaxial wafer, to form a passivation layer on the first-type semiconductor layer, the active layer and the second-type semiconductor layer of the at least one etched sidewall of the mesa.

The present disclosure provides a manufacturing machine for reducing non-radiative recombination of micro LED, which includes: at least one transmission device for transporting at least one etched LED epitaxial wafer, wherein, the etched LED epitaxial wafer includes a plurality of etched grooves and a plurality of mesas, each of the mesas includes a first-type semiconductor layer, an active layer and a second-type semiconductor layer, the active layer is positioned between the first-type semiconductor layer and the second-type semiconductor layer; at least one first ALD chamber connected to a transmission chamber, wherein, the transmission device transports the etched LED epitaxial wafer to the first ALD chamber and performs a first ALD to the etched LED epitaxial wafer within the first ALD chamber in a first temperature range; and at least one second ALD chamber connected to the transmission chamber, wherein, the transmission device transports the LED epitaxial wafer etched by the first ALD to a second ALD chamber and performs a second ALD to the etched LED epitaxial wafer within the second ALD chamber in a second temperature range, to form a passivation layer on the first-type semiconductor layer, the active layer and the second-type semiconductor layer of the at least one etched sidewall of the mesa, wherein the first temperature range and the second temperature range are different.

The present disclosure provides another manufacturing machine for reducing non-radiative recombination of micro LED, which includes: a transmission chamber including at least one transmission device for transporting at least one etched LED epitaxial wafer, wherein, the etched LED epitaxial wafer includes a plurality of etched grooves and a plurality of mesas, each of the mesas includes a first-type semiconductor layer, an active layer and a second-type semiconductor layer, the active layer is positioned between the first-type semiconductor layer and the second-type semiconductor layer; at least one reaction chamber connected to the transmission chamber, wherein, the transmission device transports the etched LED epitaxial wafer into the reaction chamber and transfers a repair gas into the reaction chamber to cause the repair gas reacting with the etched LED epitaxial wafer; and at least one ALD chamber connected to the transmission chamber, wherein, the transmission device transports the etched LED epitaxial wafer within the reaction chamber into the ALD chamber, then an ALD is performed to the etched LED epitaxial wafer within the ALD chamber, to form a passivation layer on the first-type semiconductor layer, the active layer and the second-type semiconductor layer of the at least one etched sidewall of the mesa.

The abovementioned manufacturing method for reducing non-radiative recombination of micro LED, wherein, the first ALD is employed for repairing at least one dangling bond or at least one defect on the etched LED epitaxial wafer, the second ALD is employed for disposing the passivation layer on a top surface of the mesa.

The manufacturing method for reducing non-radiative recombination of micro LED, wherein, the first ALD, the second ALD and the ALD are applied of a precursor gas which includes organic-aluminum compound, water, glycol, ozone or ethanol.

The manufacturing method for reducing non-radiative recombination of micro LED, wherein, the ALD is performed within the reaction chamber.

The manufacturing method for reducing non-radiative recombination of micro LED, which includes: providing an AC voltage to an AC coil adjacent to the reaction chamber, to transform the repair gas within a reaction chamber into a plasma, wherein, the repair gas in the plasma state reacts with the etched LED epitaxial wafer and repairs at least dangling bond or at least one defect on the etched LED epitaxial wafer, and the second ALD is performed to dispose the passivation layer on a top surface of the mesa.

The manufacturing method for reducing non-radiative recombination of micro LED, wherein the repair gas is nitrogen, oxygen or ozone.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
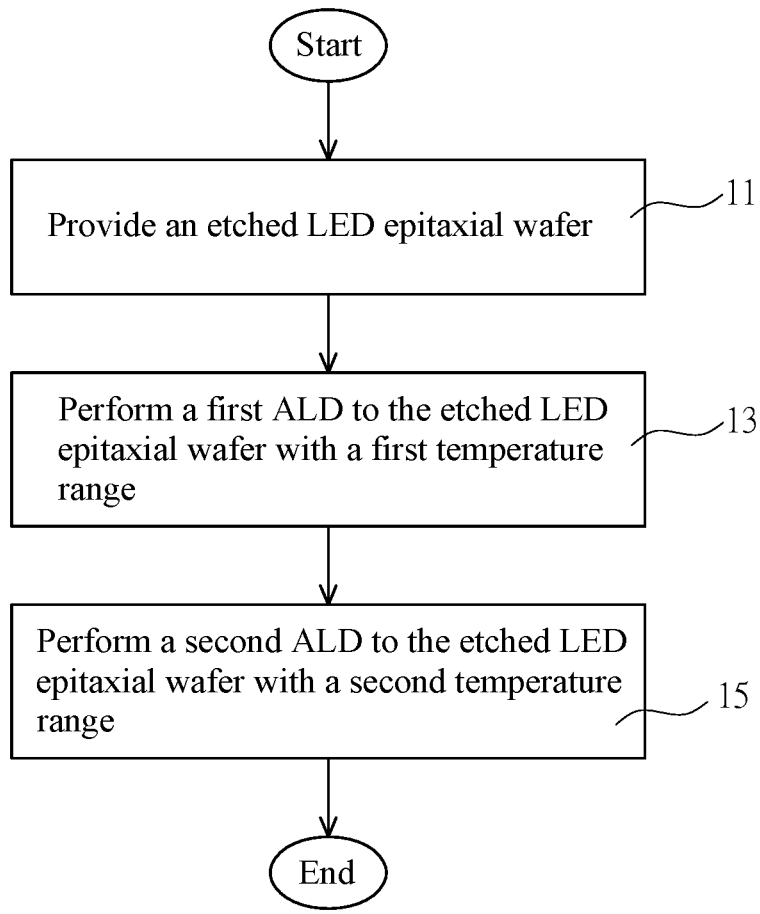
FIG. 1 is a flowchart of a manufacturing method for reducing non-radiative recombination of micro LED according to one embodiment of the present disclosure.
Figure 2:
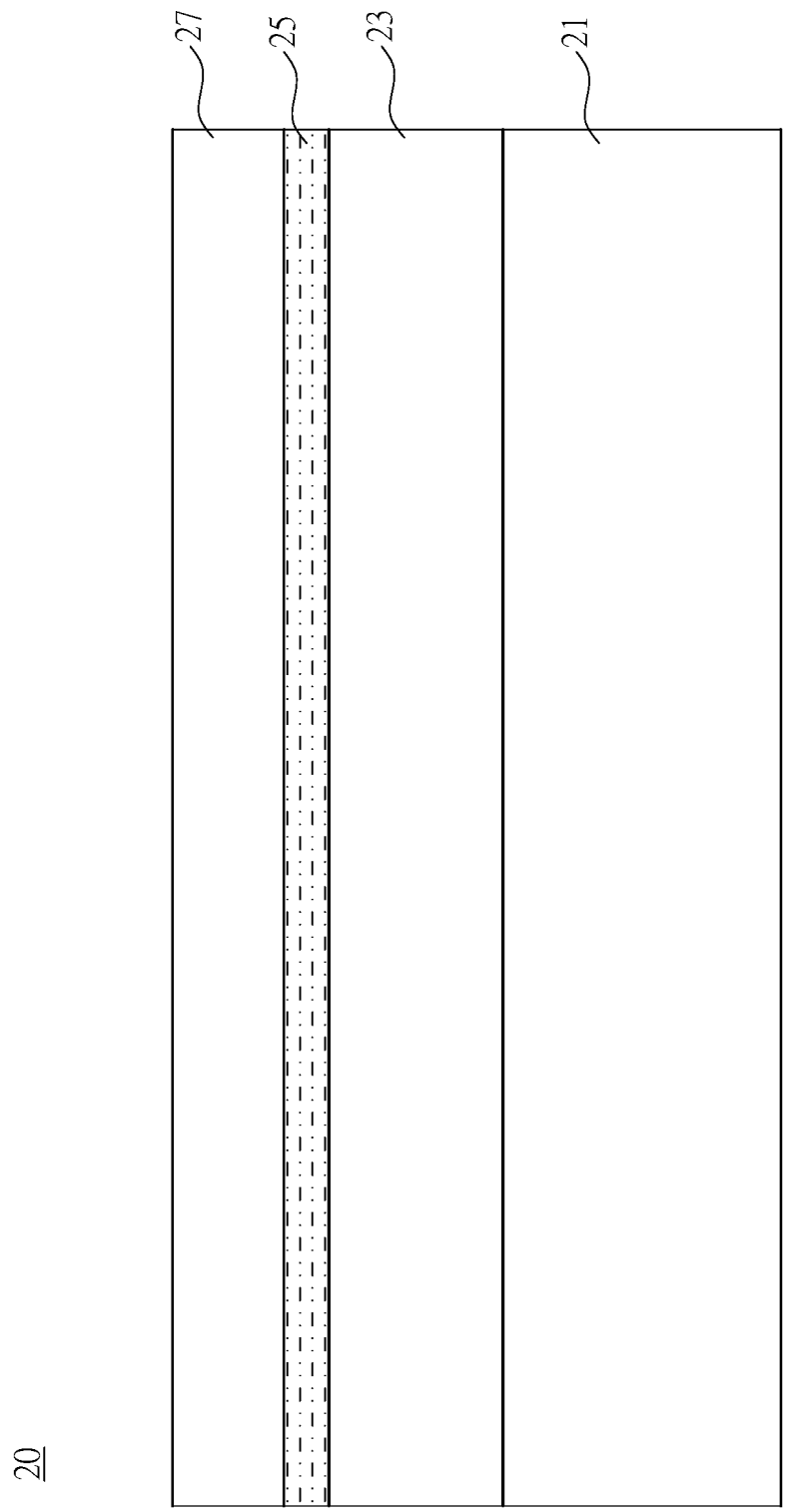
FIG. 2 is a schematic sectional view of a LED epitaxial wafer according to one embodiment of the present disclosure.

Referring to FIG. 1, which is a flowchart of a manufacturing method for reducing non-radiative recombination of micro LED (Light-emitting diode) according to one embodiment of the present disclosure. Also referring with FIG. 2~FIG. 5, the method includes a step 11, which is to provide at least one LED epitaxial wafer 20, wherein the LED epitaxial wafer 20 includes a substrate 21, a first-type semiconductor layer 23, an active layer 25 and a second-type semiconductor layer 27. In a process of manufacturing LEDs, metal-organic chemical vapor deposition (MOCVD) can be applied to sequentially grow the first-type semiconductor layer 23, the active layer 25 and the second-type semiconductor layer 27 on the substrate 21, wherein the active layer 25 is positioned between the first-type semiconductor layer 23 and the second-type semiconductor layer 27, as shown in FIG. 2. The substrate 21 is a single-crystal substrate, which is for example, made of sapphire, silicon carbide (SiC), silicon (Si), Gallium arsenide (GaAs), Lithium aluminate (LiAlO2), Magnesium oxide (MgO), Zinc oxide (ZnO), Gallium nitride (GaN), Aluminium nitride (AlN) or Indium nitride (InN). The first-type semiconductor layer 23 is an N-type semiconductor, the active layer 25 is made of multiple quantum wells, and the second-type semiconductor layer 27 is a P-type semiconductor.

A plurality of etched grooves 22 and a plurality of mesas 24 are formed on a surface of the LED epitaxial wafer 20. The etched grooves 22 exposes the first-type semiconductor layer 23, and form an etched LED epitaxial wafer 200, as shown by a step 11 in FIG. 1 and FIG. 3.

Each of the mesas 24 of the etched LED epitaxial wafer 200 includes a plurality of etched sidewalls 241. The etched sidewalls 241 are positioned at where the mesas 24 and the etched grooves 22 intersect. Each of the mesas 24 has the exposed first-type semiconductor layer 23, active layer 25 and second-type semiconductor layer 27. The etched grooves 22 may be arranged such as lines on a chase board, the mesas 24 are arrayed protrusions and may be formed in rectangular or round shapes.

In the etching process, a structure of the LED epitaxial wafer 20 is eroded, and at least one dangling bond and/or at least one defect are formed on the etched sidewalls 241 of the etched LED epitaxial wafer 200, which causes non-radiative recombination on the etched sidewalls 241.

The mesas 24, later become micro LEDs, which are extremely small-sized, such as between 10 um and 100 um, approximately small as the etched sidewalls 241 thereof. Thus when non-radiative recombination occurs on the etched sidewalls, this will greatly affect luminous brightness of the micro LEDs.

Therefore, according to the present disclosure, a first atomic-layer deposition (ALD) is performed to the etched LED epitaxial wafer 200 in a first temperature range, as shown in step 13 (FIG. 1). During the process of performing the first ALD to the etched LED epitaxial wafer 200, a precursor gas can react with the etched LED epitaxial wafer 200, repair the dangling bond and defect on the mesas 24 of the etched LED epitaxial wafer 200, and prevent non-radiative recombination occurring on the etched sidewalls 241.

Figure 4:
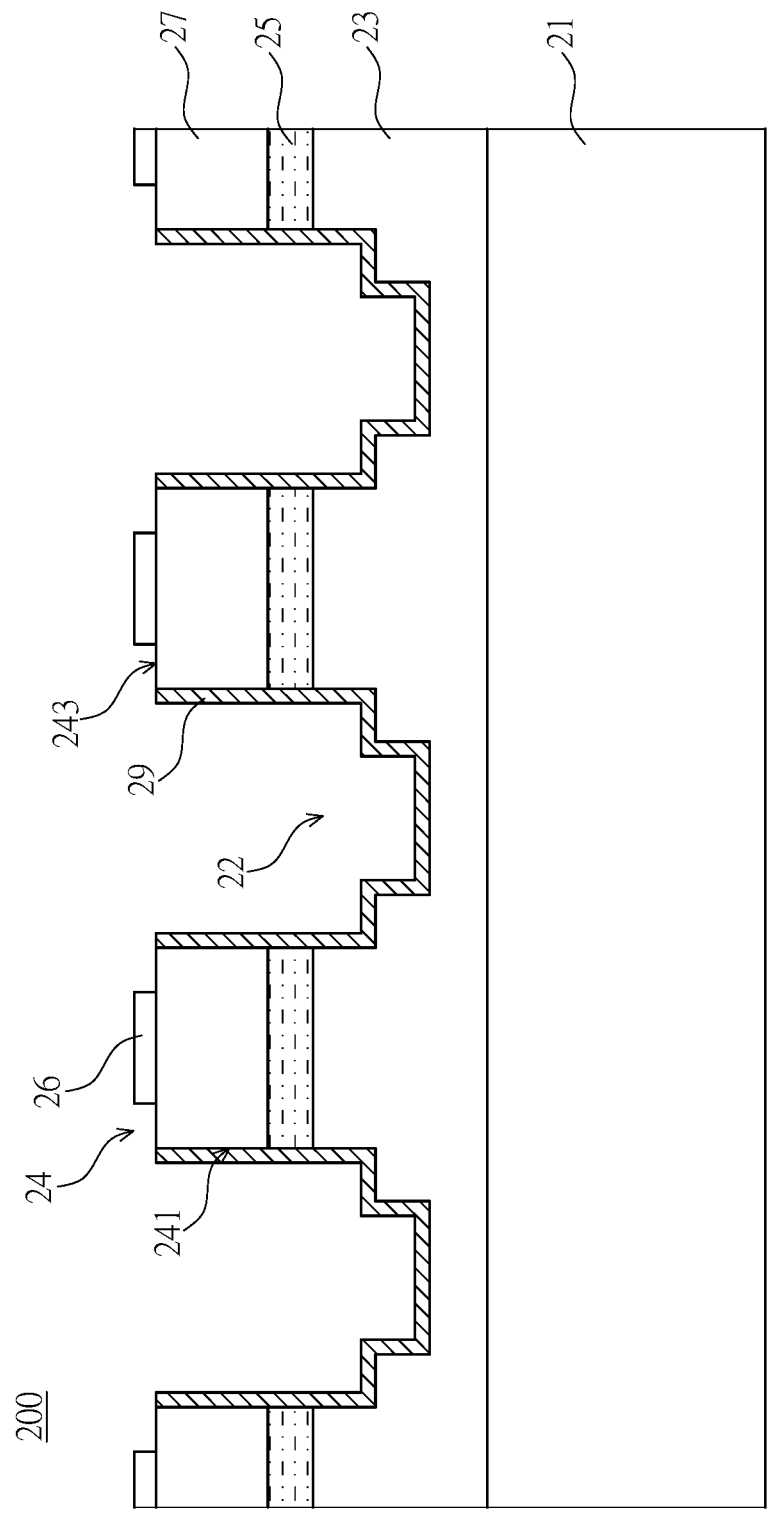
FIG. 4 is a schematic sectional view of a passivation layer disposed on the etched LED epitaxial wafer according to one embodiment of the present disclosure.

As shown in step 15 (FIG. 1) and FIG. 4, a second ALD is performed to the etched LED epitaxial wafer 200 processed by the first ALD in a second temperature range, and form a passivation layer 29 on the first-type semiconductor layer 23, the active layer 25 and the second-type semiconductor layer 27 of the etched sidewalls 241 of the mesas 24. In one embodiment according to the present disclosure, the passivation layer 29 can completely cover the etched grooves 22, such as to cover bottoms and sides of the etched grooves 22, and to prevent non-radiative recombination occurring on the etched sidewalls 241 on the mesas 24. In one embodiment of the present disclosure, the precursor gas used in the first ALD and second ALD includes organo-metallic compound, organo-silicone compound, silicon-chloride compound, organo-aluminum compound, trimethylaluminium (TMA), water, glycol, ozone or ethanol, and the passivation layer 29 may be alumina (Al2O3).

In the embodiment of the present disclosure, the first temperature range in the first ALD and the second temperature range in the second ALD are different. When the first temperature range is lower than the second temperature range, a duration of the first ALD may be extended to increase a reaction time of repairing the dangling bond and the defect on the etched sidewalls 241. Then when the first temperature range is higher than the second temperature range, an activity of the precursor gas may be raised during the first ALD, which is also helpful for repairing the dangling bond and defect on the etched sidewalls 241. To be specific, the step 13 to step 15 can be applied in batch ALD or spatial ALD. Additionally, the duration of the first ALD can be longer or even far longer than that of the second ALD.

The TABLE. 1~TABLE 4 below shows experimental data under conditions of: skipping the first ALD, only performing the second ALD; setting the first temperature range lower than the second temperature range; and setting the first temperature range higher than the second temperature range. Luminous intensity difference (%) in the following TABLEs is a comparison between micro LEDs formed by the above-mentioned manufacturing method, and micro LEDs formed by the conventional method which forms silicon dioxide (SiO2) with a thickness of 5000 Å on a micro LED epitaxial wafer. However, the experiments in TABLEs below are proceeded not such as to perform the first ALD and/or the second ALD right after etching an LED epitaxial wafer 20, hence the experimental data below are conceptional.

TABLE 1

| Parameters (unit) | Value |
|---|---|
| Skipping the first ALD, and performing the second ALD with the second temperature range set around 220° C. | luminous intensity difference (%) | −2.9% |
| | forward voltage (V) | −0.012 |
| | reverse voltage (uA) | −0.00005 |

TABLE 2

| Parameters (unit) | Value |
|---|---|
| The first temperature range is set around 200° C., the second temperature range is set around 220° C. | luminous intensity difference (%) | −1.1% |
| | forward voltage (V) | −0.001 |
| | reverse voltage (uA) | −0.000196 |

TABLE 3

| Parameters (unit) | Value |
|---|---|
| The first temperature range around is set around 270° C., the second temperature range is set around 220° C. | luminous intensity difference (%) | 4.6% |
| | forward voltage (V) | −0.11 |
| | reverse voltage (uA) | $-7.3 \times 10^{-6}$ |

TABLE 4

| Parameters (unit) | Value |
|---|---|
| The first temperature range is set around 150° C., the second temperature range is set around 220° C. | luminous intensity difference (%) | 1.3% |
| | forward voltage (V) | −0.01 |
| | reverse voltage (uA) | $-7.8 \times 10^{-6}$ |

As shown in TABLE. 1, when skipping the first ALD, brightness of the micro LEDs is not improved. As shown in TABLE. 2, the first temperature range is set around 200° C., and the second temperature range is set around 220° C., brightness of the micro LEDs has a slight improvement. As shown in TABLE. 3, the first temperature range is set around 270° C., and the second temperature range is set around 220° C., brightness of the micro LEDs has an apparent improvement. As shown in TABLE. 4, the first temperature range is set around 150° C., and the second temperature range is set around 220° C., brightness of the micro LEDs also has an apparent improvement. This shows that when the first temperature range in the first ALD and the second temperature range in the second ALD are different, the luminous brightness of the micro LEDs can all have improvement. It should be noted, the TABLEs above only show experimental data of the embodiment according to the present disclosure, the claim scope of the present disclosure is not limited thereto.

Figure 5:
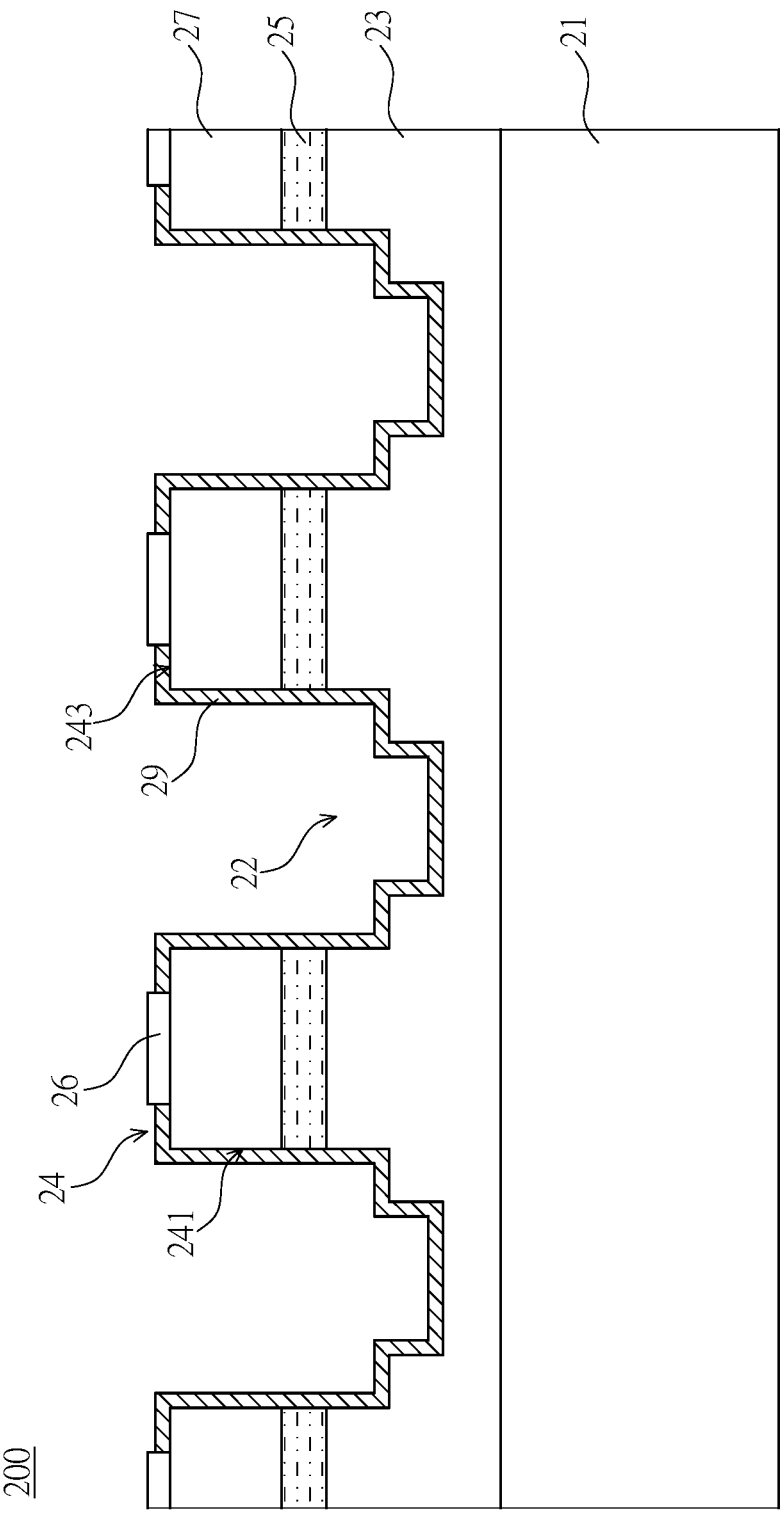
FIG. 5 is a schematic sectional view of a passivation layer disposed on the etched LED epitaxial wafer according to another embodiment of the present disclosure.

In another embodiment of the present disclosure via the second ALD, each of the mesas 24 may also has a top surface 243 disposed with the passivation layer 29, as shown in FIG. 5. The passivation layer 29 does not only cover the etched sidewalls 241 of the mesas 24, but also further extends to the top surfaces 243 of the mesas 243. Moreover, to have the passivation layer 29 disposed on the etched sidewalls 241 and top surfaces 243 of the mesas 24, the passivation layer 29 can also function as a reflective layer for reflecting light emitted from the mesas 24 of the micro LEDs.

In practical use, the mesas 24 may be pre-disposed with contact electrodes 26 thereon, and thereafter disposed with the passivation layer 29. The passivation layer 29 may contact the contact electrodes 26 in such manner, or may also be pre-disposed on the mesas 24 then have the contact electrodes 26 disposed on the mesas 24 later. After the passivation layer 29 is disposed completely, the etched LED epitaxial wafer 200 may be sliced along the etched grooves 22 thereon, to form a plurality of micro LEDs.

In one embodiment of the present disclosure, the etched LED epitaxial wafer 200 may be disposed with such as the contact electrode 26, reflective layer, transparent current-diffusion layer, etc., those are common structures in the technical field of LED, however not features of the present disclosure, thus further details are not described herein.

Figure 6:
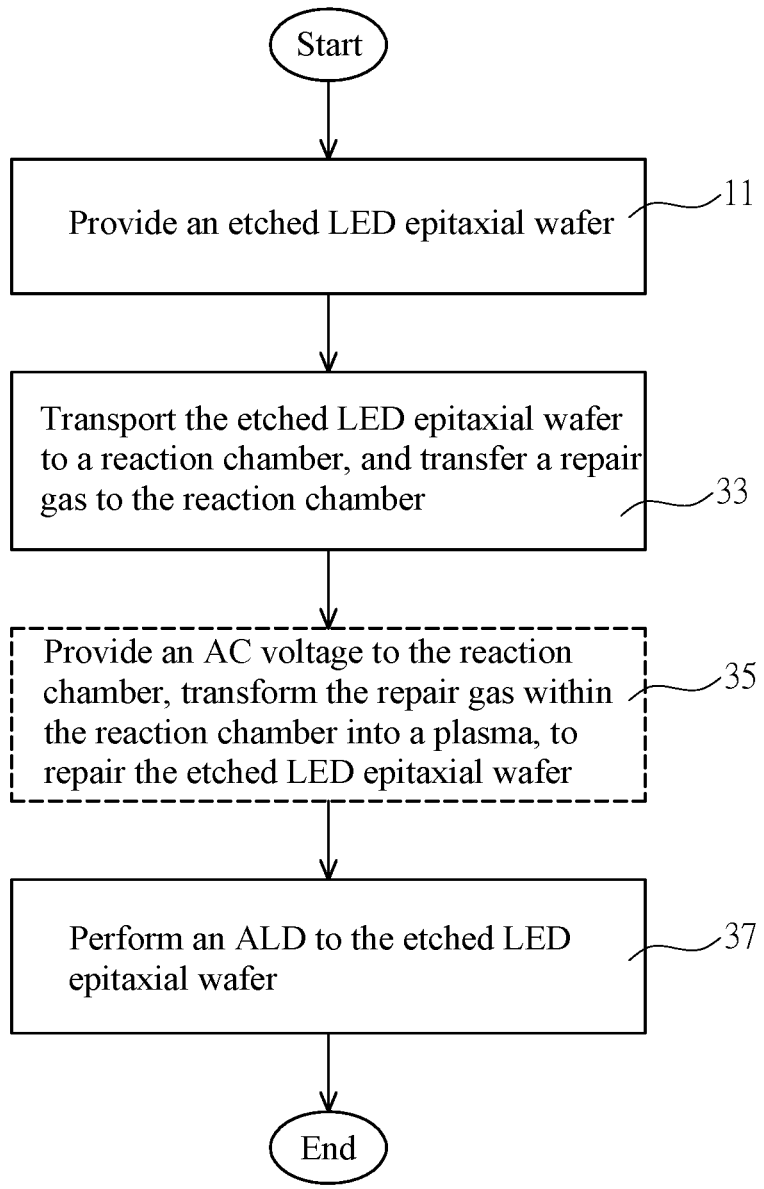
FIG. 6 is a flowchart of a manufacturing method for reducing non-radiative recombination of micro LED according to another embodiment of the present disclosure.

Referring to FIG. 6, which is a flowchart of a manufacturing method for reducing non-radiative recombination of micro LED according to another embodiment of the present disclosure. Also referring to FIG. 2~FIG. 5, the method includes a step 11, which is to first provide at least one LED epitaxial wafer 20, wherein the LED epitaxial wafer 20 includes a substrate 21, a first-type semiconductor layer 23, an active layer 25 and a second-type semiconductor layer 27.

Figure 3:
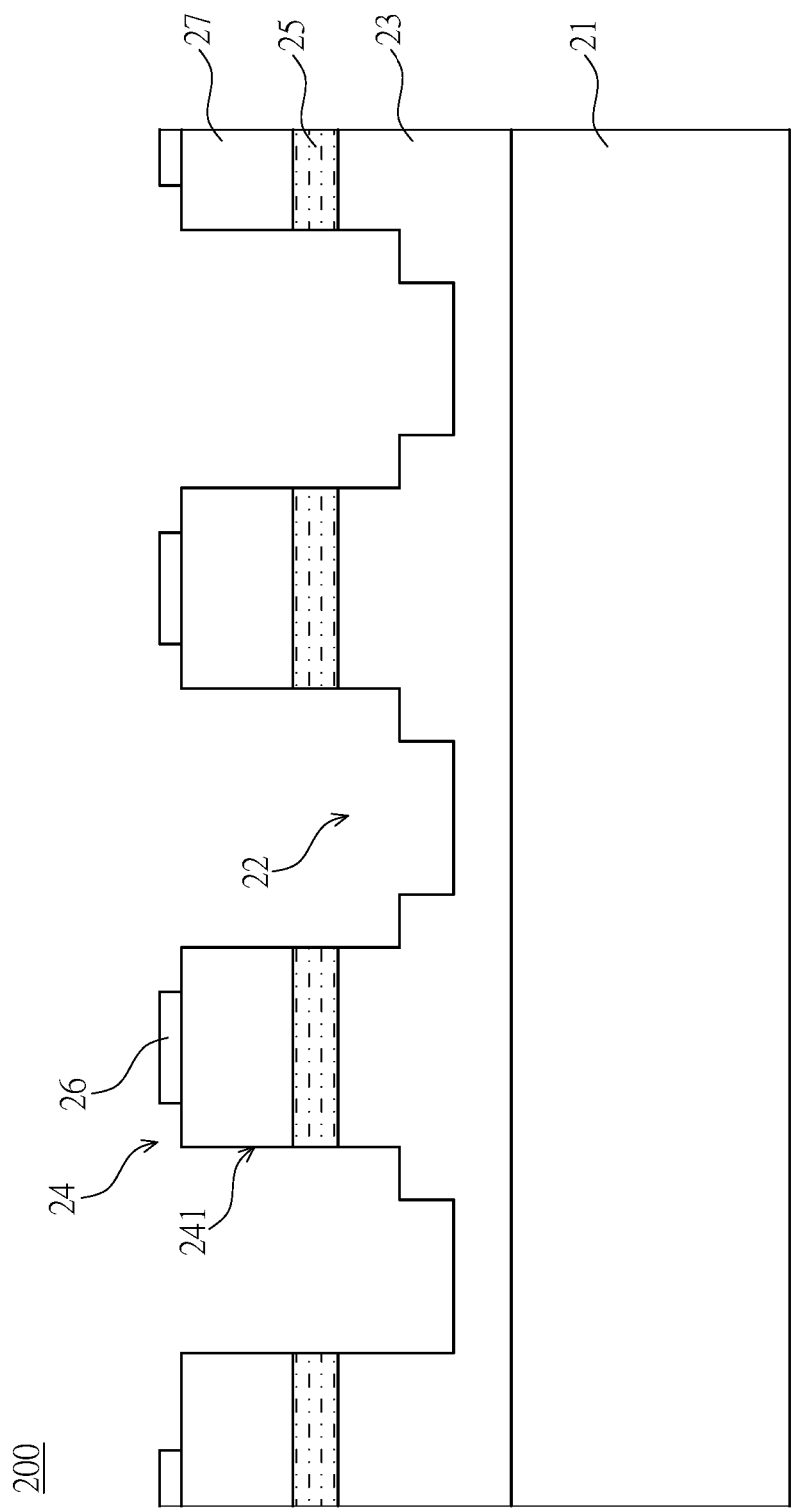
FIG. 3 is a schematic sectional view of an etched LED epitaxial wafer according to one embodiment of the present disclosure.

As shown in step 11 (FIG. 1) and FIG. 3, next is to etch the LED epitaxial wafer 20, to form a plurality of etched grooves 22 and a plurality of the mesas 24 on the LED epitaxial wafer 20, and then to form an etched LED epitaxial wafer 200. The mesas 24 of the etched LED epitaxial wafer 200 include a plurality of etched sidewalls 241, wherein the etched sidewalls 241 are positioned in where the mesas 24 and the etched grooves 22 intersect. Each of the etched sidewalls 241 has the exposed first-type semiconductor layer 23, the active layer 25 and the second-type semiconductor layer 27. The etched grooves 22 may be arranged such as lines on a chess board, and the mesas 24 may be arrayed protrusions and formed in rectangular or round shapes.

Next is as shown in step 33, which is to place the etched LED epitaxial wafer 200 into a reaction chamber, and transfer a repair gas into the reaction chamber. In practice use, different types of repair gas may be chosen according to ingredients of the first-type semiconductor layer 23, the active layer 25 and the second-type semiconductor layer 27, wherein the repair gas includes oxygen, nitrogen or ozone.

Next is as shown in step 35 (FIG. 1), which is to provide an alternative-current (AC) voltage to an AC coil adjacent to the reaction chamber, then to transform the repair gas within the reaction chamber into plasma. As shown in FIG. 5, the repair gas transformed into the plasma can react with and repair the etched LED epitaxial wafer 200. For example, when the first-type semiconductor layer 23, the active layer 25 and the second-type semiconductor layer 27 are made of indium gallium nitride (InGaN), the repair gas may be nitrogen, which can repair the dangling bond and defect on the etched sidewalls 241 of mesas 24 via the repair gas transformed into the plasma. In one embodiment of the present disclosure, the reaction chamber may be a common physical vapor deposition (PVD) chamber or an ALD chamber for the repair gas transformed into the plasma to repair the etched LED epitaxial wafer 200.

Additionally, when the repair gas is ozone, there is no need to provide AC voltage to the AC coil, but just to provide the ozone with a certain concentration into the reaction chamber, this would enable the ozone to react with the etched LED epitaxial wafer 200, then repair the dangling bond and defect on the etched sidewalls 241 of the mesas 24. Therefore the step 35 is not a sufficient one for the present disclosure, and may be determined whether to proceed or not according to the type of repair gas. Also, after transferring the repair gas into the reaction chamber, the temperature of the reaction chamber and the repair gas may increase.

As shown in step 37 (FIG. 6), next is to perform an ALD to the etched LED epitaxial wafer 200 that has been repaired, then to form a passivation layer 29 on least one etched sidewall 241 of the mesas 24. The passivation layer 29 covers the first-type semiconductor layer 23, the active layer 25 and the second-type semiconductor layer 27 on the etched sidewalls 241 of the mesas 24. In one embodiment of the present disclosure, the precursor gas used in the ALD includes organo-metallic compound, organo-silicone compound, silicon-chloride compound, organo-aluminum compound, trimethylaluminium (TMA), water, glycol, ozone or ethanol, and the passivation layer 29 may be alumina ($Al_2O_3$).

The repair reaction and the ALD process in the step 33~step 37, which may be performed in one or two different reaction chambers. For example, when a temperature of the repair reaction is approximate to or even equal to a temperature of the ALD process, the repair reaction and the ALD process may be performed together in one reaction chamber or one ALD chamber. To be specific, the step 33~step 37 can be applied in batch ALD or spatial ALD. Furthermore, the duration of the repair reaction can be longer or even far longer than that of the ALD.

Figure 7:
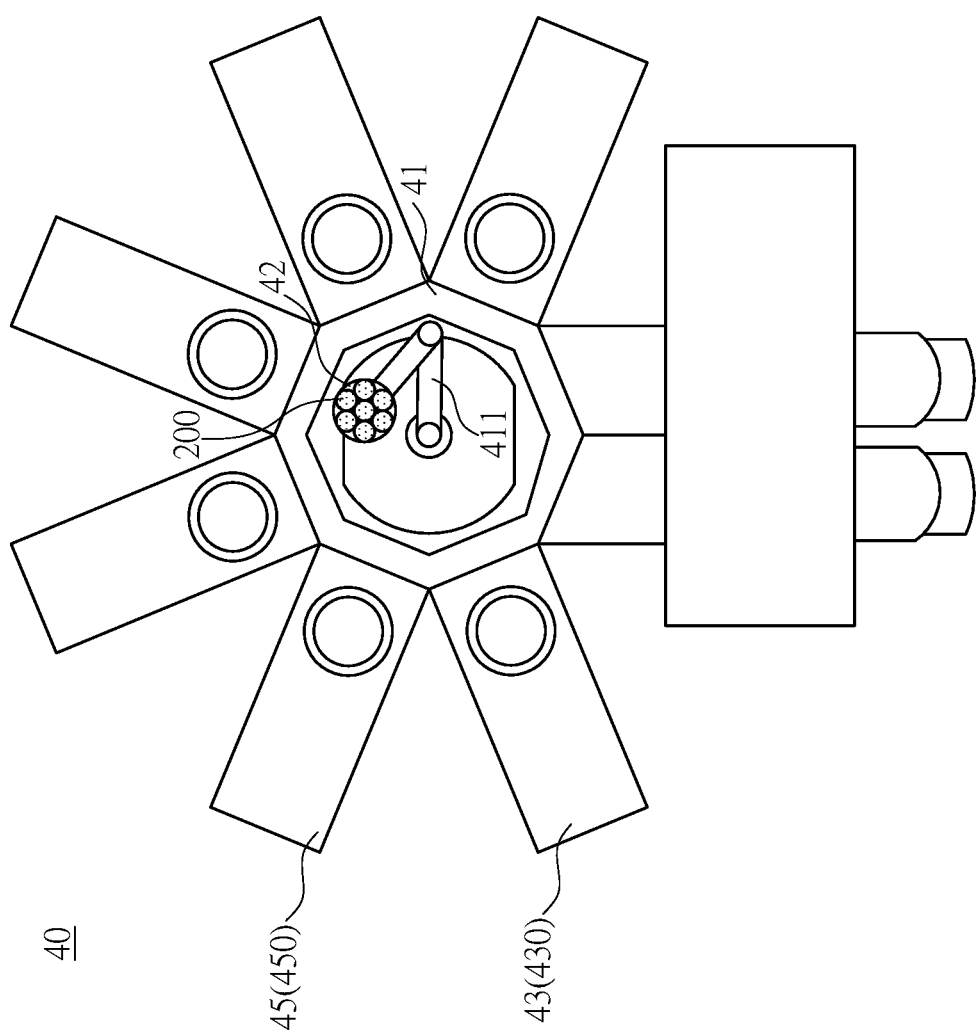
FIG. 7 is a schematic structural view of a manufacturing machine for reducing non-radiative recombination of micro LED, according to one embodiment of the present disclosure.

Referring to FIG. 7, which is a schematic structural view of a manufacturing machine 40 for reducing non-radiative recombination of micro LED, according to one embodiment of the present disclosure. Also, referring with FIG. 1, the manufacturing machine 40 of micro LED includes a transmission chamber 41, at least one first ALD chamber 43 and at least one second ALD chamber 45. The transmission chamber 41 interconnects the first ALD chamber 43 and the second ALD chamber 45, also the transmission chamber 41, the first ALD chamber 43 and the second ALD chamber 45 all retain low-pressure or vacuum within.

In one embodiment of the present disclosure, the transmission chamber 41 includes at least one transmission device 411. The transmission device 411 may be such as a robotic arm, wherein the transmission device 411 is for carrying and transporting at least one etched LED epitaxial wafer 200. In practical use, a plurality of etched LED epitaxial wafer 200 may be placed on a carrier plate 42, and to carry and transport the carrier plate 42 and the etched LED epitaxial wafer 200 via the transmission device 411. The transmission device 411 may stretch related to the first ALD chamber 43 and the second ALD chamber 45, and transport the etched LED epitaxial wafer 200 to the first ALD chamber 43 and the second ALD chamber 45, or extract the etched LED epitaxial wafer 200 from the first ALD chamber 43 and the second ALD chamber 45.

The transmission device 411 at first transports the etched LED epitaxial wafer 200 into the first ALD chamber 43, and then to perform a first ALD to the etched LED epitaxial wafer 200 in the first ALD chamber 43, with a first temperature range. When performing the first ALD within the first ALD chamber 43, the precursor gas can be used to repair the dangling bond and defect on the etched sidewalls 241 of the mesas 24, to prevent non-radiative recombination on the etched sidewall 241.

Thereafter, the transmission device 411 extracts the etched LED epitaxial wafer 200 processed by the first ALD from the first ALD chamber 43, and then transports the wafer 200 to the second ALD chamber 45. The second ALD chamber 45 then performs the second ALD to the etched LED epitaxial wafer 200 with a second temperature range, to form a passivation layer 29 on the etched sidewalls 241 of the etched LED epitaxial wafer 200, wherein the passivation layer 29 covers the first-type semiconductor layer 23, the active layer 25 and the second-type semiconductor layer 27 of the etched sidewalls 241 of the mesas 24, to prevent non-radiative recombination from occurring on the etched sidewalls 241 of the mesas 24.

In the present disclosure embodiment, the first temperature range and the second temperature range are different. When the first temperature range is lower than the second temperature range, a duration of the first ALD may be extended, and also longer a duration of repairing the dangling bond and defect on the etched sidewalls 241. When the first temperature range is higher than the second temperature range, an activity of the precursor gas during the first ALD can be increased, which is also helpful for repairing the dangling bond and defect on the etched sidewalls 241.

In another embodiment of the present disclosure, the first ALD chamber 43 may be a reaction chamber 430, the second ALD chamber 45 may be the ALD chamber 450. The reaction chamber 430 and the ALD chamber 450 are connected to the transmission chamber 41, and transport the etched LED epitaxial wafer 200 between the reaction chamber 430 and the ALD chamber 450, via the transmission device 411 of the transmission chamber 41. Additionally, the reaction chamber 430 may include an AC voltage source, for providing an AC voltage to the reaction chamber 430.

At first, the transmission device 411 transports the etched LED epitaxial wafer 200 to the reaction chamber 43, and transfers a repair gas into the reaction chamber 430. In one embodiment of the present disclosure, the manufacturing machine of micro LED 40 may include an AC coil, wherein the AC coil is adjacent to the reaction chamber 43 for forming a magnetic field within the reaction chamber 430, to transform the repair gas in the reaction chamber 430 into plasma. The repair gas transformed into the plasma reacts with the etched LED epitaxial wafer 200, and repair the etched LED epitaxial wafer 200, such as to repair the dangling bond and defect on the first-type semiconductor layer 23, the active layer 25 and the second-type semiconductor layer 27 of the etched sidewalls 241 of the mesas 24. In practical use, different repair gas may be chosen according to ingredient of the first-type semiconductor layer 23, the active layer 25 and the second-type semiconductor layer 27, wherein the repair gas includes oxygen, nitrogen or ozone.

Additionally, when the repair gas is ozone, there is no need to provide AC to the AC coil, but only the ozone with a certain concentration is required to react with the etched LED epitaxial wafer 200.

The transmission device 411 extracts the etched LED epitaxial wafer 200 which is repaired within the reaction chamber 430, then transports the etched LED epitaxial wafer 200 into the ALD chamber 450. The ALD chamber 450 performs an ALD to the etched LED epitaxial wafer 200, to form a passivation layer 29 on the etched sidewalls 241 of the mesas 24, such as to have the passivation layer 29 covers the first-type semiconductor layer 23, the active layer 25 and the second-type semiconductor layer 27 on the etched sidewalls 241 of the mesas 24, to prevent non-radiative recombination from occurring on the etched sidewalls 241 of the mesas 24.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

I claim:

1. A manufacturing method for reducing non-radiative recombination of micro LED (Light-emitting diode), comprising:
   providing at least one etched LED epitaxial wafer, wherein the etched LED epitaxial wafer comprises a plurality of etched grooves and a plurality of mesas, the mesas comprises a first-type semiconductor layer, an active layer and a second-type semiconductor layer, the active layer is positioned between the first-type semiconductor layer and the second-type semiconductor layer;
   placing the etched LED epitaxial wafer into a reaction chamber, and transferring a repair gas into the reaction chamber, wherein the repair gas reacts with the etched LED epitaxial wafer; and
   performing an ALD (atomic-layer deposition) to the etched LED epitaxial wafer and forming a passivation layer on the first-type semiconductor layer, the active layer and the second-type semiconductor layer of at least one etched sidewall of the mesas.

2. The manufacturing method for reducing non-radiative recombination of micro LED according to claim 1, wherein the ALD is performed within the reaction chamber.

3. The manufacturing method for reducing non-radiative recombination of micro LED according to claim 1, further comprising a step of providing an alternative-current (AC) voltage to the reaction chamber, to transform the repair gas within the reaction chamber into a plasma, wherein the repair gas transformed into the plasma reacts with the etched LED epitaxial wafer and repairs at least one dangling bond or at least one defect of the etched LED epitaxial wafer.

4. The manufacturing method for reducing non-radiative recombination of micro LED according to claim 1, wherein the passivation layer is disposed on a top surface of the mesas in the ALD.

5. The manufacturing method for reducing non-radiative recombination of micro LED according to claim 1, wherein the ALD is applied with a precursor gas, the precursor gas comprises organo-metallic compound, organo-silicone compound, silicone-chloride compound, water, glycol, ozone or ethanol.

6. The manufacturing method for reducing non-radiative recombination of micro LED according to claim 1, wherein the repair gas is nitrogen, oxygen or ozone.

7. The manufacturing method for reducing non-radiative recombination of micro LED according to claim 1, wherein a duration of reaction between the repair gas and the etched LED epitaxial wafer is longer than that of performing the ALD.

8. A manufacturing machine for reducing non-radiative recombination of micro LED (Light-emitting diode), comprising:
   a transmission chamber comprising at least one transmission device for transporting at least one etched LED epitaxial wafer, wherein the etched LED epitaxial wafer comprises a plurality of etched grooves and a plurality of the mesas, the mesas comprises a first-type semiconductor layer, an active layer and a second-type semiconductor layer, the active layer is positioned between the first-type semiconductor layer and the second-type semiconductor layer;
   at least one reaction chamber connected to the transmission chamber, wherein the transmission device transports the etched LED epitaxial wafer to the reaction chamber and transfers a repair gas into the reaction chamber, then causes the repair gas to react with the etched LED epitaxial wafer; and
   at least one ALD (atomic-layer deposition) chamber connected to the transmission chamber, wherein the transmission device transports the etched LED epitaxial wafer within the reaction chamber to the ALD chamber and performs an ALD to the etched LED epitaxial wafer within the ALD chamber, to form a passivation layer on the first-type semiconductor layer, the active layer and the second-type semiconductor layer on at least one etched sidewall of the mesas.

9. The manufacturing machine for reducing non-radiative recombination of micro LED according to claim 8, wherein:
   the repair gas reacts with the etched LED epitaxial wafer, repairs at least one dangling bond or the least one defect of the etched LED epitaxial wafer; and
   the ALD chamber disposes the passivation layer on a top surface of the mesas.

10. The manufacturing machine for reducing non-radiative recombination of micro LED according to claim 8, wherein:
    the reaction chamber comprises an alternative-current (AC) voltage source for providing an AC voltage to the reaction chamber, to transform the repair gas within the reaction chamber into a plasma; and
    the repair gas transformed into the plasma reacts with the etched LED epitaxial wafer and repairs at least one dangling bond or at least one defect of the etched LED epitaxial wafer.

11. The manufacturing machine for reducing non-radiative recombination of micro LED according to claim 8, wherein the ALD chamber is applied with a precursor gas which comprises organo-metallic compound, organo-silicone compound, silicone-chloride compound, water, glycol, ozone or ethanol.

12. The manufacturing machine for reducing non-radiative recombination of micro LED according to claim 8, wherein the repair gas applied in the reaction chamber is nitrogen, oxygen or ozone.

* * * * *